（12) United States Patent
Schittler Neves et al.

(10) Patent No.: US 11,322,461 B2
(45) Date of Patent: May 3, 2022

(54) PACKAGE WITH INTEGRATED MULTI-TAP IMPEDANCE STRUCTURE

(71) Applicant: Infineon Technologies AG, Neubiberg (DE)

(72) Inventors: Eduardo Schittler Neves, Olching (DE); Dan Horia Popescu, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/992,874

(22) Filed: Aug. 13, 2020

(65) Prior Publication Data

US 2021/0050311 A1 Feb. 18, 2021

(30) Foreign Application Priority Data

Aug. 14, 2019 (DE) ...................... 10 2019 121 894.2

(51) Int. Cl.
| | |
|---|---|
| *H01L 23/64* | (2006.01) |
| *H01L 23/495* | (2006.01) |
| *H01L 21/56* | (2006.01) |
| *H01L 23/00* | (2006.01) |
| *H01L 23/31* | (2006.01) |

(52) U.S. Cl.
CPC ............ *H01L 23/645* (2013.01); *H01L 21/56* (2013.01); *H01L 23/4952* (2013.01); *H01L 24/48* (2013.01); *H01L 23/3107* (2013.01); *H01L 23/49562* (2013.01); *H01L 2224/48175* (2013.01)

(58) Field of Classification Search
CPC ... H01L 23/645; H01L 21/56; H01L 23/4952; H01L 24/48; H01L 23/3107; H01L 23/49562; H01L 2224/48175
See application file for complete search history.

(56) References Cited

U.S. PATENT DOCUMENTS

| | | | |
|---|---|---|---|
| 6,066,890 | A | 5/2000 | Tsui et al. |
| 7,002,220 | B1 | 2/2006 | Jin et al. |
| 7,119,448 | B1 | 10/2006 | de Stasi |
| 9,524,941 | B2 | 12/2016 | Otremba |
| 2002/0153938 | A1 | 10/2002 | Baudelot et al. |
| 2005/0285262 | A1 | 12/2005 | Knapp et al. |

FOREIGN PATENT DOCUMENTS

| | | |
|---|---|---|
| DE | 199 38 302 | 3/2000 |
| DE | 102 11 831 | 10/2003 |
| DE | 10 2012 019 391 | 4/2014 |

*Primary Examiner* — Robert G Bachner
(74) *Attorney, Agent, or Firm* — Dicke, Billig & Czaja, PLLC

(57) ABSTRACT

A package is disclosed. In one example the package comprises a carrier having a plurality of leads and an electronic component mounted on the carrier and comprising at least one pad. An impedance structure electrically couples the at least one pad with the carrier so that, at different ones of the leads, different impedance values of the impedance structure can be tapped.

17 Claims, 2 Drawing Sheets

US 11,322,461 B2

PACKAGE WITH INTEGRATED MULTI-TAP IMPEDANCE STRUCTURE

CROSS-REFERENCE TO RELATED APPLICATION

This Utility patent application claims priority to German Patent Application No. 10 2019 121 894.2, filed Aug. 14, 2019, which is incorporated herein by reference.

BACKGROUND

The present invention relates to packages and a method of manufacturing a package.

Packages may be denoted as encapsulated electronic chips with electrical connects extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application.

SUMMARY

The present disclosure provides a package and method of manufacturing a package with proper electric performance.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION

Figure 1:
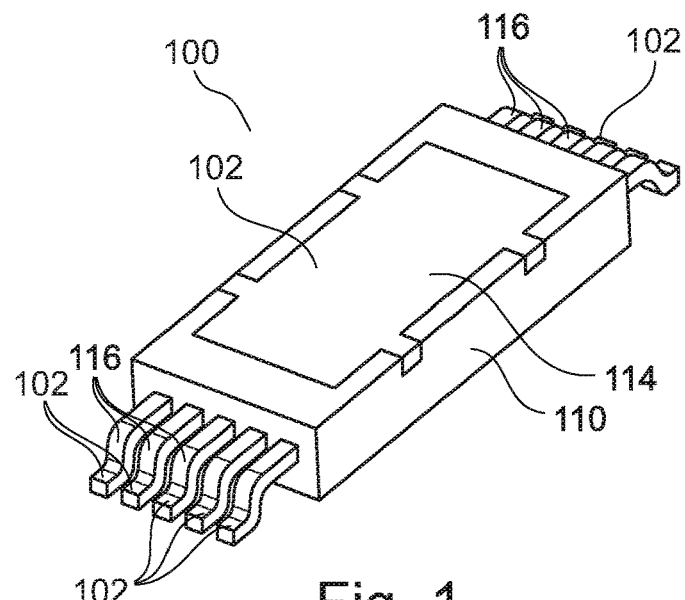
FIG. 1 illustrates a three-dimensional view of a package according to an exemplary embodiment.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

The illustration in the drawing is schematically and not to scale.

According to an exemplary embodiment, a package is provided which comprises a carrier having a plurality of leads, an electronic component mounted on the carrier and comprising at least one pad, and an impedance structure electrically coupling the at least one pad with the carrier so that, at different ones of the leads, different impedance values of the impedance structure can be tapped.

According to another exemplary embodiment, a package is provided which comprises a carrier comprising a mounting section and multiple leads, an electronic component mounted on the mounting section and comprising at least one pad, and a plurality of bond wires connected between the at least one pad and the leads to thereby form an impedance structure with a selectable value of impedance.

According to yet another exemplary embodiment, a method of manufacturing a package is provided, wherein the method comprises mounting an electronic component, comprising at least one pad, on a carrier having a plurality of leads, electrically coupling the at least one pad with the carrier by an impedance structure so that, at different ones of the leads, different impedance values of the impedance structure can be tapped, and at least partially encapsulating the electronic component, the carrier and the impedance structure by an encapsulant.

According to an exemplary embodiment, a package and a manufacturing method for manufacturing such a package may be provided with a low effort implementation of a selectable impedance, for example for providing a damping inductor. Such an impedance structure may be located very close to an assigned pad of the electronic component (for example a gate pad of a transistor chip), for instance by simply using bond wires for forming the impedance structure. An impedance structure, in particular formed by interconnected bond wires, may improve the electric performance inside a package (for example comprising one or more discrete power MOSFETs), since an adjustable value of the impedance may be provided by the impedance structure. Descriptively speaking, a respective adjustable value of the impedance may be selected by a circuit designer by simply selecting which of multiple leads shall be used for connecting electronic circuitry to the package. The corresponding impedance value will then be provided by the section of the impedance structure being connected between a pad of the electronic component and the selected lead. Advantageously, the provision of different leads (which may be exposed with respect to an encapsulant so as to be accessible to a circuit designer) may make it possible to connect the different leads with different sections of the impedance structure. As a result, it is possible for the circuit designer to tap a certain section of the integrated impedance structure and to thereby select one of multiple different values of the impedance between electronic component and the selected external lead. With very low effort this may allow for an efficient design of the electronic circuitry provided by the package having a multi-tap inductor. For instance, by providing an impedance with proper value, undesired electronic phenomena such as parasitic ringing artefacts may be efficiently suppressed. Additionally or alternatively, the provision of an impedance structure integrated in the package may also improve the EMI (electromagnetic interference) characteristic of the package.

In the following, further exemplary embodiments of the packages and the method will be explained.

A gist of an exemplary embodiment can be seen in the provision of a multi-tap impedance structure integrated in a package. More specifically, with the continued miniaturization of packages (in particular discrete high-voltage switch packages), it may happen that multiple leads of a carrier are available, but are not required for providing the electronic functionality of such a package. Advantageously, such available and unused leads may be functionalized by creating an impedance structure (for example by connecting bond wires or other electrically conductive structures) between the leads in an interior of the package so as to form a variable impedance. Variation of the impedance is possible by simply selecting one of multiple leads, for instance either providing no, a partial, or a full connection with the impedance structure. As a result, a tapped inductor may be integrated in a lead-comprising package substantially without additional effort.

In the context of the present application, the term "package" may particularly denote an electronic device which may comprise one or more electronic components mounted on a carrier. Optionally, at least part of the constituents of the package may be encapsulated at least partially by an encapsulant. Further optionally, one or more electrically conductive interconnect bodies (such as bond wires and/or clips) may be implemented in a package, for instance for electrically coupling the electronic component with the carrier.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated. Semiconductor chips implemented according to exemplary embodiments may be formed in silicon technology, gallium nitride technology, silicon carbide technology, etc.

In the context of the present application, the term "encapsulant" may particularly denote a substantially electrically insulating and preferably thermally conductive material surrounding an electronic component and optionally part of a carrier to provide mechanical protection, electrical insulation, and optionally a contribution to heat removal during operation.

In the context of the present application, the term "carrier" may particularly denote a support structure (preferably, but not necessarily electrically conductive) which serves as a mechanical support for the one or more electronic components, and which may also contribute to the electric interconnection between the electronic component(s) and the periphery of the package. In other words, the carrier may fulfil a mechanical support function and an electric connection function.

In the context of the present application, the term "mounting section" may particularly denote a support structure of the carrier on which the electronic component is to be mounted. When the carrier is a leadframe, the mounting section may be a die pad.

In the context of the present application, the term "lead" may particularly denote an electrically conductive (for instance strip shaped) element of the carrier (which may be planar or bent) which serves for contacting the electronic component from an exterior of the package. For instance, a lead may be fully exposed with respect to an encapsulant or may be partially encapsulated and partially exposed. When the carrier is a leadframe, leads may surround a die pad.

In the context of the present application, the term "impedance structure" may particularly denote a physical and at least partially electrically conductive structure which is configured to provide an impedance between the electronic component and the carrier. Impedance may denote a complex-valued generalization of resistance. One or more constituents of impedance provided by the impedance structure may be ohmic resistance, capacitance and/or inductance. For instance, such an impedance may be an inductance (which may for example be formed by forming a loop of electrically conductive wires). Additionally or alternatively, such an impedance may be a capacitance and/or an ohmic resistance.

In the context of the present application, the term "bond wires" may particularly denote tiny electrically conductive wires which can be used for contacting a carrier with an electronic component mounted on the carrier. In the context of exemplary embodiments, such bond wires may be used, additionally or alternatively, for establishing an impedance structure, in particular in inductor structure.

In a preferred embodiment, the impedance structure is an inductor structure which is configured so that, at different ones of the leads, different inductance values can be tapped. Tapping one of different inductance value at different leads of the package has turned out as a highly efficient mechanism of suppressing ringing of the package. In the context of the present application, the term "ringing" may particularly denote an undesired or parasitic phenomenon according to which a signal applied to an electronic component carries out an oscillation, for instance in terms of a switch-on effect and/or a switch-off effect. When providing a package with an encapsulated electronic component, an integrated multi-tap inductor may be advantageous for suppressing ringing. As a result of this configuration, it may be possible to suppress or even eliminate ringing phenomena which may occur when applying a signal to an electronic component with very low impedance. Thus, the impedance structure may provide a sufficiently large impedance so as to suppress undesired ringing.

However, selecting a gate pin among multiple leads may not only change the inductance, but may also change the gate resistance. Moreover, there may be cases where even different capacitance values of the impedance structure may lead to an improved filter behavior. Thus, the impedance structure may provide a selectable value of ohmic resistance, capacitance and/or inductance.

In an embodiment, the package may comprise an encapsulant at least partially encapsulating at least one of the group consisting of the electronic component, the carrier, and the impedance structure (which may particular be embodied as inductor structure). Thus, in particular the impedance structure may be integrated within the encapsulant and thus properly protected with respect to an environment. Package external circuit elements for providing a multi-tap impedance structure may thus be dispensable. Hence, in particular the impedance structure may be at least partially encapsulated by an encapsulant and is therefore not only properly mechanically protected against damage during manufacture and operation of the package, but can also be formed in a miniature way within the encapsulant so as to provide a compact package. Said impedance structure may be connected between the electronic component (which may be encapsulated as well) and the carrier (which may be partially encapsulated) on which the electronic component is mounted.

In an embodiment, the impedance structure is formed by a plurality of interconnected electrically conductive elements. Descriptively speaking, by interconnecting multiple electrically conductive elements, a three-dimensionally shaped structure may be formed which effectively creates an impedance in the interior of the package. Thus, the described configuration may form the impedance structure with low effort.

In an embodiment, the interconnected electrically conductive elements are arranged to form at least one loop (in particular a plurality of loops). It may be particularly advantageous to form the impedance structure as a loop having one or multiple windings in the interior of the package, because the value of the inductance of the impedance structure may be the larger, the larger the number of loops is. Therefore, adjusting the number of loops is also a simple way of adjusting a desired value of the inductance.

In another embodiment, the interconnected electrically conductive elements are arranged to form a spiral. For instance, such a spiral may be formed on the basis of bond wires, bond ribbons and/or clips. A spiral shape allows providing a sufficiently high value of the inductance in a compact configuration. Tapping of a spiral may be accomplished at different windings thereof, so as to enable a user to select one of multiple discrete values of the inductance by correspondingly contacting one of multiple leads connected to different windings of the spiral.

However, other shapes of the interconnected electrically conductive elements are possible in other embodiments, for instance the shape of at least one meander, at least one zigzag structure, etc. The trajectory defined by the interconnected electrically conductive elements may be in particular a zigzag trajectory, which promotes formation of a high inductance with low space consumption.

In an embodiment, at least part of the interconnected electrically conductive elements extends between different leads of the carrier. Advantageously, an array of anyway present leads at two opposing sides of the package may be used for connecting the interconnected electrically conductive elements with each other. For instance, bond wires may be used to connect leads of a leadframe on two opposing sides of the component of the package.

In an embodiment, said at least part of the interconnected electrically conductive elements extends over and above the electronic component in between said different ones of the leads of the carrier. This may result in a space-saving and compact configuration of the package.

In an embodiment, another one of the interconnected electrically conductive elements extends between the at least one pad and a lead of the carrier. Thus, a further interconnected electrically conductive element may be used for connecting the pad of the (in particular semiconductor chip type) electronic component with the impedance structure at a common lead. This is a very simple way of connecting the embedded or encapsulated electronic component with an electronic environment via the impedance structure.

In an embodiment, the electronic component is mounted on a mounting section (such as a die pad) of the carrier being separated from the different leads. The interconnected electrically conductive elements may thus be spanned between opposing leads and extending over a centrally positioned electronic component on the central mounting section. By taking this measure, the impedance structure may be arranged spatially close to the electronic component. This may be particularly advantageous for suppressing undesired ringing effects, and may contribute to a compact design.

In an embodiment, at least part of a main surface of such a mounting section of the carrier, on which mounting section the electronic component is mounted, is exposed with respect to the encapsulant for promoting removal of heat generated during operation of the electronic component. The mounting section may be spatially separate from the leads. For example, at least part of a main surface of the mounting section may be exposed with respect to the encapsulant for removing heat generated during operation of the at least one electronic component. Thus, an electronic component (such as a power semiconductor chip) may be mounted on one main surface of the mounting section, while an opposing other main surface of the mounting section may be exposed with respect to the encapsulant for an efficient heat removal to an exterior of the package. This may ensure efficient cooling of the package.

In an embodiment, the interconnected electrically conductive elements are bond wires. For example, such bond wires may have a circular, rectangular or flat cross-section. Thus, the bond wires may be electrically conductive oblong structures which have any desired cross-section. They may for instance have a circular cross-section. However, it is also possible to use electrically conductive ribbons as bond wires with a strip shaped or flat cross-section. Using bond wires for forming the impedance structure is a particularly simple and space-saving embodiment.

However, configuring the impedance structure from bond wires is not the only option. In another embodiment it may also be possible to connect two or more clips or other electrically conductive bodies so as to provide an impedance structure.

In an embodiment, the electronic component is a power semiconductor chip. Correspondingly, the package may be configured as power package. In terms of power conductor chips, problems with ringing effects are particularly pronounced. Thus, the integration of an impedance structure, in particular made of interconnected bond wires, is particularly advantageous for power semiconductor devices.

In an embodiment, the electronic component is a transistor chip, in particular, a MOSFET (metal oxide semiconductor field effect transistor) chip. In particular, a gate pad of a transistor chip may be prone to ringing. Thus, the impedance structure may be connected between the gate pad of a transistor chip and an exterior lead of a leadframe type carrier.

In an embodiment, the electronic component is configured to experience a vertical current flow during operation. In such an embodiment, it is for example possible that a source pad and a gate pad are arranged on one main surface of a semiconductor chip type electronic component, and the drain pad on the opposing other main surface. In particular connecting the gate pad with the impedance structure may be of advantage for obtaining a proper electric performance. During operation, the current may flow vertically between the one or more pads on an upper main surface and the one or more pads on a lower main surface of the electronic component.

In an embodiment, the impedance structure electrically couples a gate pad of the electronic component with a selectable gate lead of the carrier. When connecting the impedance structure to a gate pad, the improvement of the electronic performance of the package is particularly pronounced, and one of the multiple leads can be selected from an exterior side of the package to act as gate lead in accordance with a desired value of the impedance (in particular inductance).

In an embodiment, the impedance structure—when embodied as inductor structure—is configured to provide at least two different values of inductance in a range between 5 nH and 500 nH, in particular in a range between 10 nH and 50 nH. For instance, the inductor structure may provide an inductance of at least 10 nH, in particular at least 40 nH. It has turned out that in particular the mentioned values of the inductance are advantageous for efficiency suppressing ringing.

In an embodiment, different values of the impedance of the impedance structure are selectable by selecting an assigned one of the leads. More specifically, a respective one of different discrete values of the impedance of the impedance structure may be selectable by selecting an assigned one of the leads. For instance, by forming an electrically conductive connection with a selected lead and a mounting base (such as a printed circuit board) on which the package is to be mounted, said selected lead may define a selected value of impedance provided by the partially or fully tapped impedance structure.

In an embodiment, the impedance structure is connected for damping ringing of the electronic component. Descriptively speaking, the selected value of impedance (in particular inductance) provided by the impedance structure in combination with a gate-source-capacitance of the (for instance high-power discrete-switch type) electronic component may effectively form a frequency filter damping ringing effects in form of undesired oscillation phenomena, for instance when switching off the package.

In an embodiment, the carrier comprises a leadframe, in particular comprising a die pad and a plurality of leads. Such a leadframe may be a sheet-like metallic structure which can be patterned so as to form one or more die pads or mounting sections for mounting the one or more electronic components of the package, and one or more lead sections for an electric connection of the package to an electronic environment when the electronic component(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically advantageous configuration in which a low ohmic connection of the at least one electronic component can be combined with a robust support capability of the leadframe. Furthermore, a leadframe may contribute to the thermal conductivity of the package and may remove heat generated during operation of the electronic component(s) as a result of the high thermal conductivity of the metallic (in particular copper) material of the leadframe. A leadframe may comprise for instance aluminum and/or copper. In the context of the present application, the term "die pad" may particularly denote a portion of a leadframe being shaped and dimensioned for accommodating an electronic component such as a semiconductor chip. Correspondingly, the surface area of the die pad is usually flat and planar and sufficiently large for fully receiving the chip or die thereon. In contrast to this, the term "leads" may particularly denote another portion of a leadframe which may at least partially extend beyond an encapsulant (if present) and serves as connection element to an electronic periphery of the package. It is for instance possible that one or more terminals of the electronic component mounted on the die pad is or are electrically connected to a respective one of the leads, for instance by a clip, bond wire or bond ribbon. It is for instance possible that the die pad is encapsulated and the leads are partially or entirely exposed with regard to an encapsulant. It is also possible that the die pad forms a central portion of a leadframe type carrier, whereas the leads may form a peripheral portion of the leadframe. Both die pads and leads may at least partially comprise a metallic material. More generally, the carrier may be a partially or entirely metallic structure.

In another embodiment, the carrier comprises a stack composed of a central electrically insulating and thermally conductive layer (such as a ceramic layer) covered on both opposing main surfaces by a respective electrically conductive layer (such as a copper layer or an aluminum layer, wherein the respective electrically conductive layer may be a continuous or a patterned layer), a Direct Copper Bonding (DCB) substrate, and a Direct Aluminum Bonding (DAB) substrate.

In an embodiment, the package comprises an encapsulant, in particular a mold compound, encapsulating only part of the carrier, at least part of the electronic component and at least part of the bond wires or other type of impedance structure. When encapsulating by molding, injection molding or transfer molding may be carried out, for example. Hence, the encapsulant may comprise a mold, in particular a plastic mold. For instance, a correspondingly encapsulated body (in particular electronic component with carrier) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties. In other exemplary embodiments, the encapsulant may also be a casting component.

In an embodiment, all leads or terminals may protrude laterally out of the encapsulant (which may correspond to a leaded package architecture). However, it is also possible that the package is a leadless package.

In an embodiment, a connection between the electronic component, the carrier and/or the impedance structure is formed by a connection medium. For instance, the connection medium may be a solder structure, a sinter structure, a welding structure, and/or a glue structure. Thus, mounting the electronic component on the carrier and/or connecting the impedance structure between electronic component and carrier may be accomplished by soldering, sintering or welding, or by adhering or gluing.

In an embodiment, the package comprises a plurality of electronic components mounted on the carrier. Thus, the package may comprise one or more electronic components (for instance at least one passive component, such as a capacitor, and at least one active component, such as a semiconductor chip).

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the package is configured as power converter, in particular one of an AC/DC power converter and a DC/DC power converter. However, also other electronic applications, such as inverters, etc. may be possible.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

Before exemplary embodiments will be described in more detail referring to the Figures, some general considerations will be summarized based on which exemplary embodiments have been developed.

According to an exemplary embodiment, an integrated impedance structure (preferably embodied as inductor structure) of a package may be provided. In particular, the impedance structure may be embodied as an integrated bond wire impedance structure. Such a configuration may be particularly advantageous for power applications and may suppress undesired phenomena such as ringing. Advantageously, such an impedance structure may be provided in such a way that—by selecting one of multiple leads connected to different sections or portions of the impedance structure for an exterior electric connection of the package—it is possible to adjust an impedance value between the electronic component of the package and an exterior lead.

Advantageously, exemplary embodiments may be implemented in medium and high voltage discrete power MOSFETs. MOSFET chips are becoming smaller and smaller driven by optimization of the effort involved with the manufacturing process. One direct consequence of this miniaturization of packages is higher efficiency, in particular faster switching and reduced capacitances.

On the other hand, ease of use may suffer with further miniaturization of packages, in particular due to ringing effects. In electronics and signal processing, ringing may denote an oscillation of a signal, in particular in response to a sudden change of an input signal. Often ringing is undesirable. In particular in a transistor chip, gate-to-source-voltage ringing may lead to unwanted turn-on of turn-off effects or a malfunctioning of the gate driver. Gate-to-source voltage ringing can be also seen as a decisive parameter for quality evaluation of a package.

An exemplary embodiment may improve ease of use of a package while simultaneously obtaining a high efficiency, by implementing an integrated multi-tap impedance structure.

A gist of an exemplary embodiment relates to the implementation of an integrated high-impedance impedance structure (preferably embodied as high-inductance inductor structure) positioned very near to a corresponding pad of an electronic component, in particular a chip gate electrode. In a particularly preferred embodiment, this can be achieved by a series of extra bond wires inside the package. Advantageously, such an integrated impedance structure may remove any need for an external surface mounted device (SMD), such as an external inductor, resistor, etc. Furthermore, such an embodiment may provide a superior performance and low effort in terms of implementation.

Exemplary embodiments are compatible with very different package designs. In particular, exemplary embodiments can be implemented with DDPACK, QDPACK, DSO and TOLL type packages. Basically, exemplary embodiments implementing an impedance structure can be applied to any package, in particular those having free leads or pins.

The implementation of exemplary embodiments is possible with low effort. In one embodiment, such an implementation may be made by merely adding a series of bond wire loops between the inner part of a gate lead and a gate pad on the chip type electronic component. Via the gate lead, a gate signal may be applied to the package.

Figure 2:
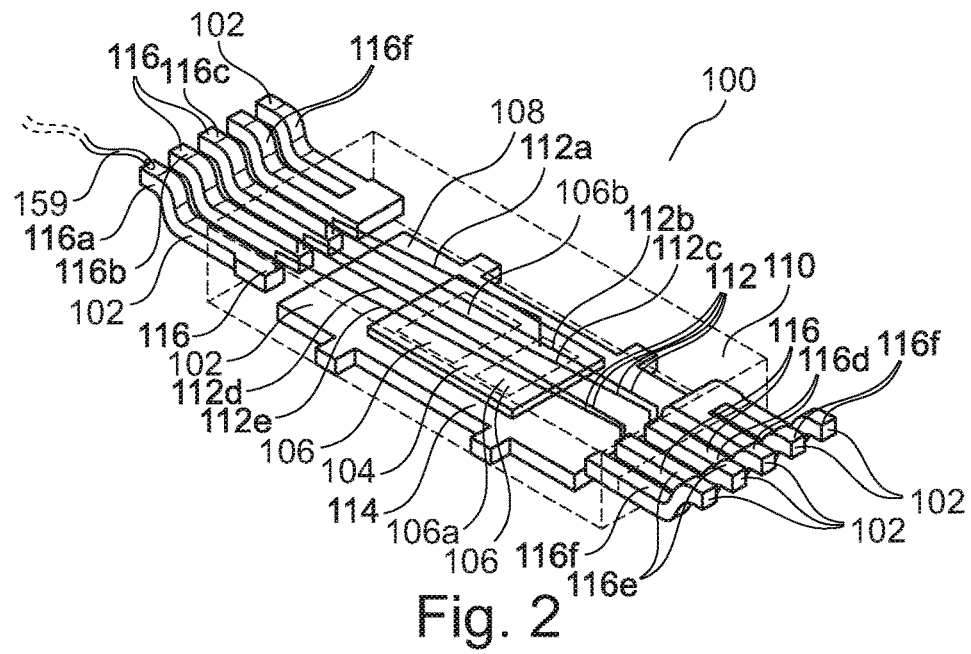
FIG. 2 illustrates a transparent three-dimensional view of the package according to FIG. 1.
Figure 3:
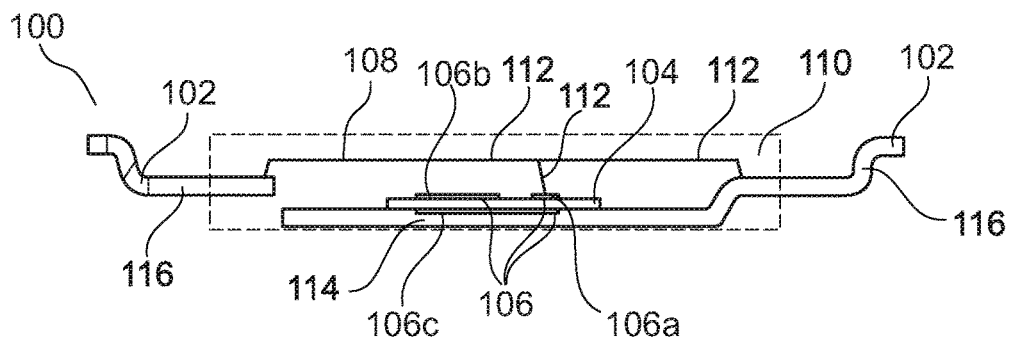
FIG. 3 illustrates a cross-sectional view of the package according to FIG. 1 and FIG. 2.

FIG. 1 illustrates a three-dimensional view of a package 100 according to an exemplary embodiment. FIG. 2 illustrates a transparent three-dimensional view of the package 100 according to FIG. 1. FIG. 3 illustrates a cross-sectional view of the package 100 according to FIG. 1 and FIG. 2. The shown implementation relates to a bond wire inductor (as described below in detail) of package 100. Just as an example, package 100 of FIG. 1 is designed as a DDPACK type package.

In FIG. 1 to FIG. 3, semiconductor package 100 is shown which comprises a leadframe-type carrier 102, an electronic component 104 (for instance a semiconductor chip, in particular a power transistor chip) mounted on the carrier 102, and a mold-type encapsulant 110 encapsulating the electronic component 104 and only one part of the carrier 102.

The electronic component 104 is configured as a power transistor semiconductor type with vertical current flow (i.e. a current flow in the vertical direction according to FIG. 3). Electronic component 104 has three pads 106. On a top main surface of the electronic component 104, a gate pad 106a, and a source pad 106b are provided. On a bottom main surface of the electronic component 104, a drain pad 106c is formed.

The leadframe type carrier 102 comprises a mounting section 114, embodied as die pad, and multiple leads 116. Carrier 102 can be made of copper. As shown, the mounting section 114 of the carrier 102 is spatially separated from some of the leads 116. The mounting section 114 is located between a first group of leads 116 on the left-hand side and a second group of leads 116 on the right-hand side of the mounting section 114. The electronic component 104 is mounted on one main surface of the mounting section 114, for instance by soldering. As shown in FIG. 1 and FIG. 3, the opposing other main surface of the mounting section 114 is exposed with respect to the encapsulant 110 for promoting removal of heat generated during operation of the package 100 by the power semiconductor chip type electronic component 104.

For instance in order to avoid ringing of the power transistor type electronic component 104 during operation of the package 100, an impedance structure 108 is electrically connected between the electronic component 104 and some of the leads 116 and is encapsulated in the encapsulant 110. In the shown embodiment, the impedance structure 108 is embodied as inductor structure providing different values of the inductance, which may be individually tapped by a user by selecting one of leads 116a to 116e for supplying a signal to gate pad 106a. The impedance structure 108 electrically couples the gate pad 106a with the carrier 102. The impedance structure 108 is here constituted by plurality of bond wires 112a to 112e connected between the gate pad 106a and some of the leads 116a to 116e. As shown in FIG. 2, said bond wires 112a to 112e are arranged to form a plurality of loops constituting an electrically conductive coil structure and thereby providing an inductance. As shown, each of the bond wires 112b to 112e extend between two respective leads 116a to 116e of the carrier 102 along a zigzag trajectory. As can be taken from FIG. 2, the interconnected electrically conductive elements, which are here embodied in form of bond wires 112b to 112e, extend over and above the electronic component 104 in between said leads 116a to 116e, but remain located within encapsulant 110. As a result, the package 100 having the shown impedance structure 108 can be manufactured in a compact way. Another one of the bond wires 112a extends between the gate pad 106a and lead 116c of the carrier 102. Number of loops, cross-sectional area of a loop and other geometric parameters of the bond wires 112 or other interconnected electrically conductive elements may be adjusted to obtain a desired value of the impedance. For instance, an appropriate value of the impedance of the impedance structure 108 which can be tapped at lead 116a, which is connected to electrically conductive connection element 159, may be 45 nH.

As shown in the illustrated example, the plurality of bond wires 112 comprise bond wire 112a connecting the gate pad 106a with lead 116c, further bond wires 112b to 112d connecting said lead 116c with further leads 116d, 116b, 116e, and a last bond wire 112e providing a connection to the lead 116a, which is here selected for connection with electrically conductive connection element 159.

Advantageously and as best seen in FIG. 2, by electrically connecting a selected one of the leads 116a to 116e—being connected with a respective number of said bond wires 112a to 112e—with an electronic periphery of the package 100 by electrically conductive connection element 159, a selectable value of the impedance provided by a part of the bond wires 112a to 112e extending between the gate pad 106a and the selected lead—in the shown example lead 116a connected with electrically conductive connection element 159—may be adjusted. In other words, the different leads 116a to 116e are connected to different sections of the serially arranged bond wires 112a to 112e so that, at different ones of the leads 116a to 116e, different impedance values of the impedance structure 108 can be tapped. For example and again referring to FIG. 2, by forming an electrically conductive connection in form of electrically conductive connection element 159 to lead 116a, all bond wires 112a to 112e are effective to contribute to an inductance between gate pad 106a and lead 116a. As a consequence, a maximum inductance of for instance 45 nH may be tapped at lead 116a. In contrast to this, by forming an electrically conductive connection for example to lead 116b (not shown), a smaller portion of said bond wires 112a to 112e, i.e. only bond wires 112a to 112c, is effective as contributing to the inductance between gate pad 106c and lead 116b. As a consequence, a smaller inductance of for instance 30 nH may be tapped at lead 116b. By forming an electrically conductive connection to lead 116c, an even smaller portion of the bond wires 112a to 112e, i.e. only bond wire 112a, is effective to contribute to the impedance between gate pad 106a and lead 116c. Still other values of the inductance may be tapped by connecting electrically conductive connection element 159 to one of leads 116d, 116e. Thus, the impedance structure 108 provides a user with the opportunity to select a selectable value of impedance (or more specifically inductance), depending on the requirements of a certain application.

What concerns its electronic functionality, the impedance structure 108 electrically couples the gate pad 106a of the electronic component 104 with a selectable gate lead 116a to 116e of the carrier 102. Depending on the selection which of the leads 116a to 116e shall be electrically connected as gate lead for supplying a gate signal, a selection of the value of the inductance added between the gate pad 106a and the selected gate lead 116 can be made. According to FIG. 2, the selected gate lead is lead 116a, since electrically conductive connection element 159 has been electrically connected to lead 116a (for instance by soldering). As can be taken from FIG. 1 to FIG. 3, without adding size, the package 100 is thus equipped with an integrated multi-tap impedance structure 108.

As best seen in FIG. 2, the impedance structure 108 is configured as an array of (substantially but not exactly parallel) aligned interconnected electrically conductive elements in form of bond wires 112a to 112e which run forward and backward between leads 116a to 116e of the leadframe type carrier 102. Connection element or bond wire 112a extends from gate pad 106a to lead 116c of the leadframe type carrier 102 on the left-hand side of the package 100. Electrically conductive connection element or bond wire 112b extends from the mentioned lead 116c to a further lead 116d on the opposing other side of the package 100. Said electrically conductive connection element or bond wire 112b also extends over the electronic component 104 mounted on the mounting section 114 of the carrier 102. As shown, any desired number of further electrically conductive connection elements or bond wires 112c, 112d, 112e may then be used for forming one or more further loops of the impedance structure 108 between further leads 116a, 116b, 116e until a desired value of the impedance is achieved. The last electrically conductive connection element or bond wire 112e of the impedance structure 108 is connected to gate lead 116a. This provides an external electric connection to the selected gate lead 116a with maximum impedance of the fully tapped impedance structure 108 in between. As a result of the shown architecture, the impedance structure 108 provides an adjustable inductance of for instance up to 45 nH without substantial additional effort and without increasing the dimension of the package 100, for instance to suppress ringing.

FIG. 2 also shows optional further leads 116f which are not electrically coupled with connection elements, such as bond wires 112a to 112e, of the impedance structure 108.

FIG. 3 illustrates a cross-sectional view of a circuit diagram schematically illustrating a circuitry of a package 100 according to another exemplary embodiment.

Figure 4:
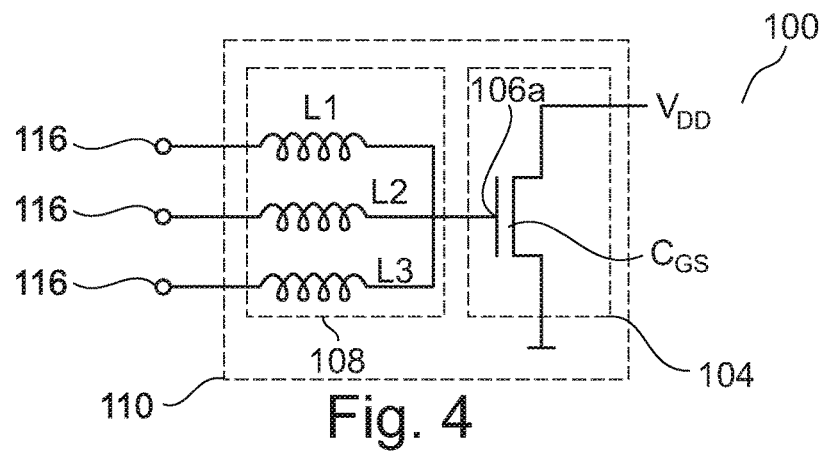
FIG. 4 illustrates a circuit diagram schematically illustrating a circuitry of a package according to another exemplary embodiment.

FIG. 4 illustrates an electronic circuit providing a performance similar to that of package 100 illustrated in FIG. 1 to FIG. 3. As shown, electronic component 104 is configured as a MOSFET chip, see gate pad 106a. An electric supply voltage $V_{DD}$ may be supplied to package 100. As shown, the MOSFET has a gate-source capacitance $C_{GS}$. Impedance structure 108 is interconnected between several leads 116 and gate pad 106a. By tapping a portion of said impedance structure 108 by selecting a respective one of the leads 116 for electric connection for supplying a gate signal, different values of the inductance L1, L2 or L3 may be selected. In a scenario in which L1>L2>L3, the uppermost lead 116 may for instance correspond to lead 116a of FIG. 2, the lead 116 in the middle may correspond for instance to lead 116b of FIG. 2, and the lowermost lead 116 may for instance correspond to lead 116c of FIG. 2.

The gate-source capacitance $C_{GS}$ together with the selected value of the inductance L1, L2 or L3 may effectively form a frequency filter damping oscillations in terms of undesired ringing. Since a ringing frequency may depend on a specific design of package 100, it may be desired to select a specific one of the values of the inductance L1, L2 or L3 to efficiently suppress ringing in a specific package design. This can be done by simply selecting one of the leads 116 of FIG. 4 for connection within an electronic periphery, thereby selecting a certain one of the values of the inductance L1, L2 or L3 and finally a frequency filter range for suppressing ringing.

Figure 5:
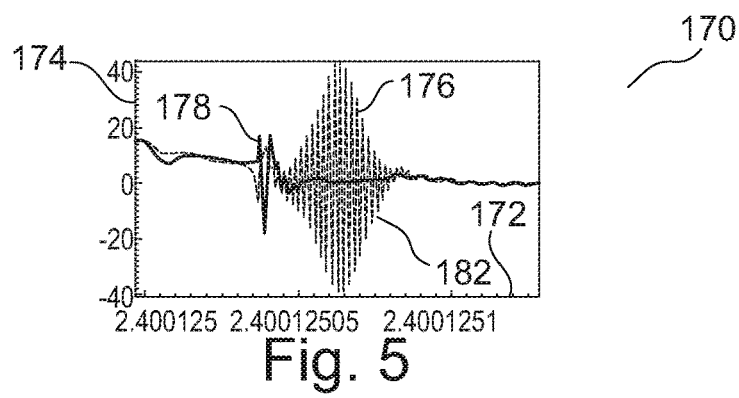
FIG. 5 and FIG. 6 illustrate a damping effect of an integrated inductor structure of a package according to an exemplary embodiment on a gate-source voltage for two external gate resistor values.
Figure 6:
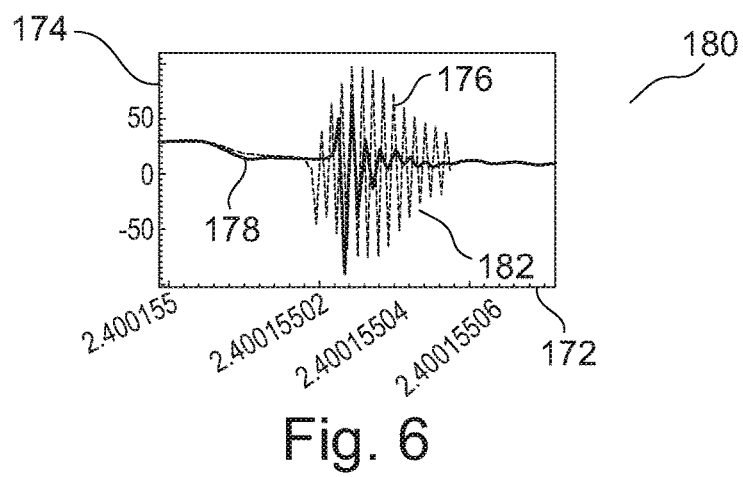

FIG. 5 and FIG. 6 show diagrams 170, 180 which illustrate a damping effect of an integrated inductor 108 of a package 100 according to an exemplary embodiment on ringing of a gate-source voltage for two different external gate resistor values.

FIG. 5 shows diagram 170 illustrating the damping effect of an integrated inductor 108 of a package 100 according to an exemplary embodiment. The diagram 170 according to FIG. 5 has an abscissa 172 along which the time is plotted in seconds. Along an ordinate 174, a gate-to-source voltage is plotted in Volt. Diagram 180 has an abscissa 172 along which again time is plotted in seconds. Along an ordinate 174 of diagram 180, the gate-to-source voltage is again plotted in Volt. The diagram 170 relates to an external gate resistance of 10 Ohm and a drain current of 46 A. The diagram 180 relates to an external gate resistance of 0.5 Ohm and a drain current of 52 A. In FIG. 5 and FIG. 6, behavior of a conventional package is shown with reference numeral 176. In contrast to this, the performance of a package 100 according to an exemplary embodiment with integrated impedance structure 108 is shown with curve 178. As can be taken from FIG. 5 and FIG. 6, the ringing effects in form of parasitic oscillation denoted with reference numeral 182, can be significantly suppressed with the integrated impedance structure 108 according to an exemplary embodiment.

Thus, an analysis has been performed in order to assess the impact of the integrated impedance structure 108 according to FIG. 1 to FIG. 3 on the ringing behavior of a 180 mOhm MOSFET switch type package 100. The gate-to-source voltage waveforms, with and without the added bond wires 112 providing an impedance structure 108 are shown in FIG. 5 and FIG. 6. The damping effect on the gate-to-source voltage ringing amplitudes for two switching conditions can clearly be observed. As shown, the difference in the damping behavior is significant. The test system chosen for this experiment has been extensively calibrated through measurements of several existing technologies. Therefore, this model is considered accurate in predicting the switching behavior of power MOSFETs.

Figure 7:
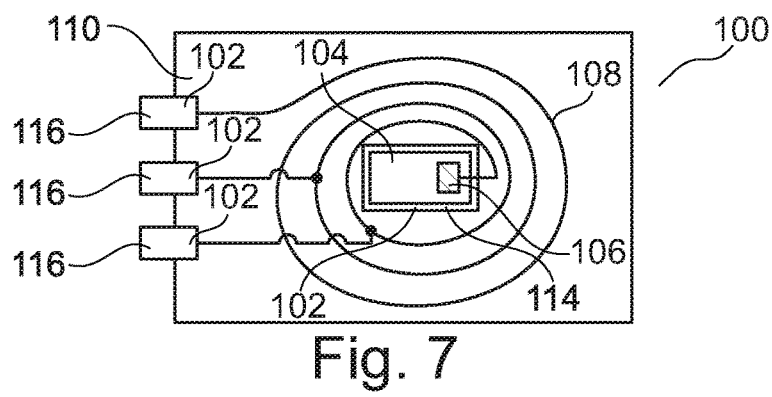
FIG. 7 illustrates a cross-sectional view of a package according to another exemplary embodiment.

FIG. 7 illustrates a cross-sectional view of a package 100 according to another exemplary embodiment.

According to FIG. 7, the impedance structure 108 is formed by a spirally wound electrically conductive interconnection element. For instance, such a spiral may be formed by patterning a metal plate or by winding a metallic wire. At different windings of the spiral, a respective one of multiple leads 116 taps a partial impedance (in particular inductance) of the spiral. As a result, the impedance provided by a corresponding section of the spiral between pad 106 and a respective one of the leads 116 can be selected by a circuit designer by selecting one of the multiple leads 116 for connection with an electronic periphery. For instance, the selection of an appropriate value of the impedance may be made in accordance with a respective value of the inlet capacitance of the electronic component 104.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A package, comprising:
a carrier having a plurality of leads;
an electronic component mounted on the carrier and comprising at least one pad; and
an impedance structure electrically coupling the at least one pad with the carrier so that, at different ones of the leads, different impedance values of the impedance structure can be tapped;
wherein the impedance structure is formed by a plurality of interconnected electrically conductive elements,
wherein at least part of the interconnected electrically conductive elements extends between different ones of the leads of the carrier,
wherein said at least part of the interconnected electrically conductive elements extends over and above the electronic component which is arranged in between said different ones of the leads.

2. The package according to claim 1, wherein the impedance structure is an inductor structure so that, at different ones of the leads, different inductance values can be tapped.

3. The package according to claim 1, wherein the interconnected electrically conductive elements are arranged to form at least one of the group consisting of at least one loop, in particular a plurality of loops, at least one spiral, at least one meander, and at least one zigzag structure.

4. The package according to claim 1, wherein at least part of the interconnected electrically conductive elements extends between different ones of the leads of the carrier, along a zigzag trajectory.

5. The package according to claim 1, wherein another one of the interconnected electrically conductive elements extends between the at least one pad and one of the leads of the carrier.

6. The package according to claim 1, wherein the interconnected electrically conductive elements are bond wires, in particular having one of a circular, rectangular or flat cross-section.

7. The package according to claim 1, comprising an encapsulant at least partially encapsulating at least one of the group consisting of the electronic component, the carrier, and the impedance structure, wherein in particular at least part of a main surface of a mounting section of the carrier, on which mounting section the electronic component is mounted, is exposed with respect to the encapsulant for promoting removal of heat generated during operation of the electronic component.

8. The package according to claim 1, comprising at least one of the following features:
wherein the electronic component is a transistor chip, in particular a MOSFET chip;
wherein the electronic component is configured to experience a vertical current flow during operation;
wherein the electronic component is a power semiconductor chip.

9. The package according to claim 1, wherein the impedance structure electrically couples a gate pad of the electronic component with a selectable gate lead of the carrier.

10. The package according to claim 1, wherein the impedance structure is configured to provide at least two different values of inductance in a range between 5 nH and 500 nH.

11. A package, comprising:
a carrier comprising a mounting section and multiple leads;
an electronic component mounted on the mounting section and comprising at least one pad; and
a plurality of bond wires connected between the at least one pad and the leads to thereby form an impedance structure with a selectable value of impedance;
wherein the plurality of bond wires comprises a first bond wire connecting one of the at least one pad with a first lead, at least one second bond wire connecting the first lead with at least one second lead, and a third bond wire connecting at least one of the second leads with a third lead.

12. The package according to claim 11, wherein a respective one of different discrete values of the impedance of the impedance structure is selectable by selecting an assigned one of the leads.

13. The package according to claim 11, wherein the impedance structure is connected for damping ringing of the electronic component.

14. The package according to claim 11, wherein the carrier is a leadframe.

15. The package according to claim 11, wherein the impedance structure is an inductor structure with a selectable value of inductance.

16. The package according to claim 11, wherein the plurality of bond wires comprises at least two second bond wires connecting the first lead with at least two second leads.

17. The package according to claim 11, comprising an encapsulant, in particular a mold compound, encapsulating only part of the carrier, at least part of the electronic component and at least part of the bond wires.

* * * * *